United States Patent [19]

Imamiya et al.

[11] Patent Number: 5,233,566
[45] Date of Patent: Aug. 3, 1993

[54] ADDRESS DETECTOR OF A REDUNDANCY MEMORY CELL

[75] Inventors: Keniti Imamiya, Yokohama; Shigeru Atsumi; Sumio Tanaka, both of Tokyo, all of Japan

[73] Assignee: Kabushiki Kaisha Toshiba, Kawasaki, Japan

[21] Appl. No.: 614,140

[22] Filed: Nov. 16, 1990

[30] Foreign Application Priority Data

Nov. 16, 1989 [JP] Japan .................. 1-296275

[51] Int. Cl.⁵ .................. G11C 7/00; G11C 29/00
[52] U.S. Cl. .................. 365/230.08; 365/200; 365/201; 365/225.7
[58] Field of Search .............. 365/200, 230.08, 189.07, 365/225.7, 201, 189.11, 189.05

[56] References Cited

U.S. PATENT DOCUMENTS 4,648,075  3/1987  Segawa et al. .............. 365/200
4,860,260  8/1989  Saito et al. .............. 365/201

FOREIGN PATENT DOCUMENTS 59-124098  7/1984  Japan .
62-293598  12/1987  Japan .

Primary Examiner—Joseph A. Popek
Attorney, Agent, or Firm—Banner, Birch, McKie & Beckett

[57] ABSTRACT

An address detector of a redundancy memory cell is provided including a programming element for storing address data for replacing a defective cell with the redundancy cell. In a test mode, the redundancy cell may be written to regardless of whether or not a memory cell is defective. Thus, the redundancy cell may be tested without programming a programming element that replaces a defective cell with a redundancy cell. The detector further includes a latch for latching the state of the programming element, and a data setting element for setting the latch in a test mode.

24 Claims, 5 Drawing Sheets

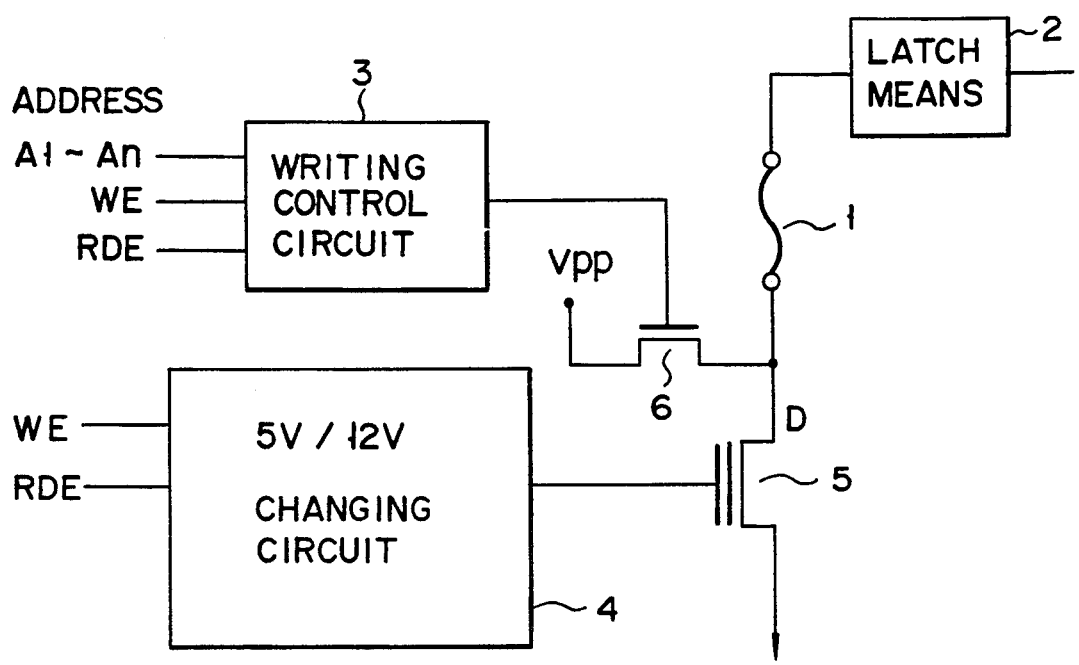
F I G. 1
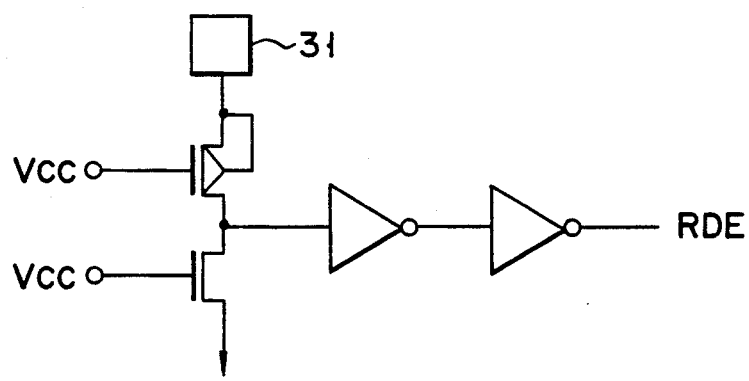
F I G. 2

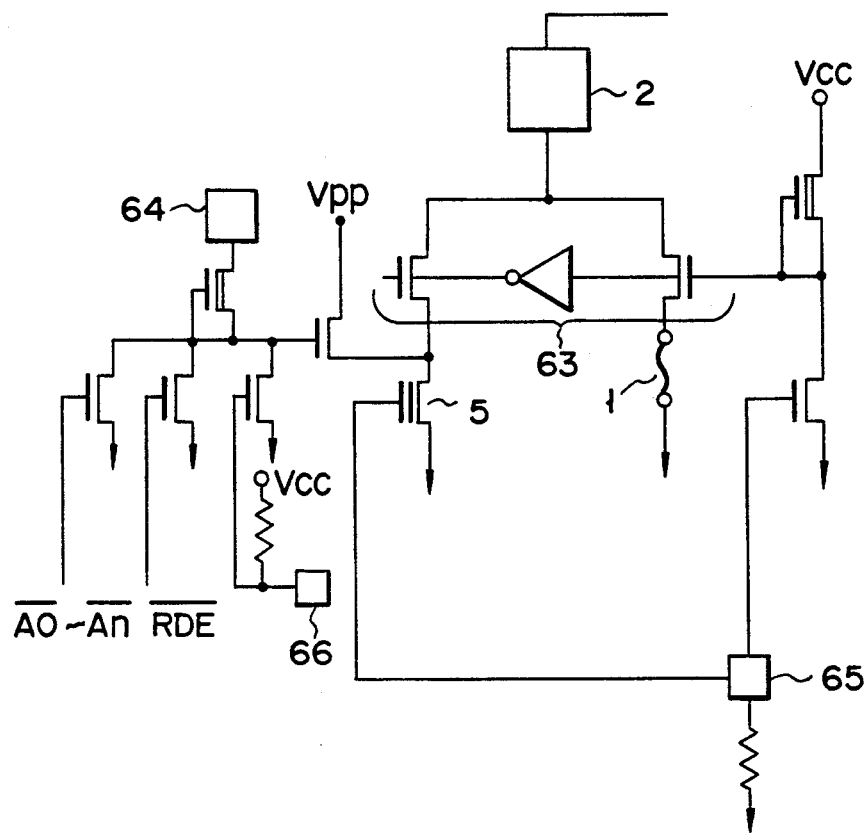
F I G. 5
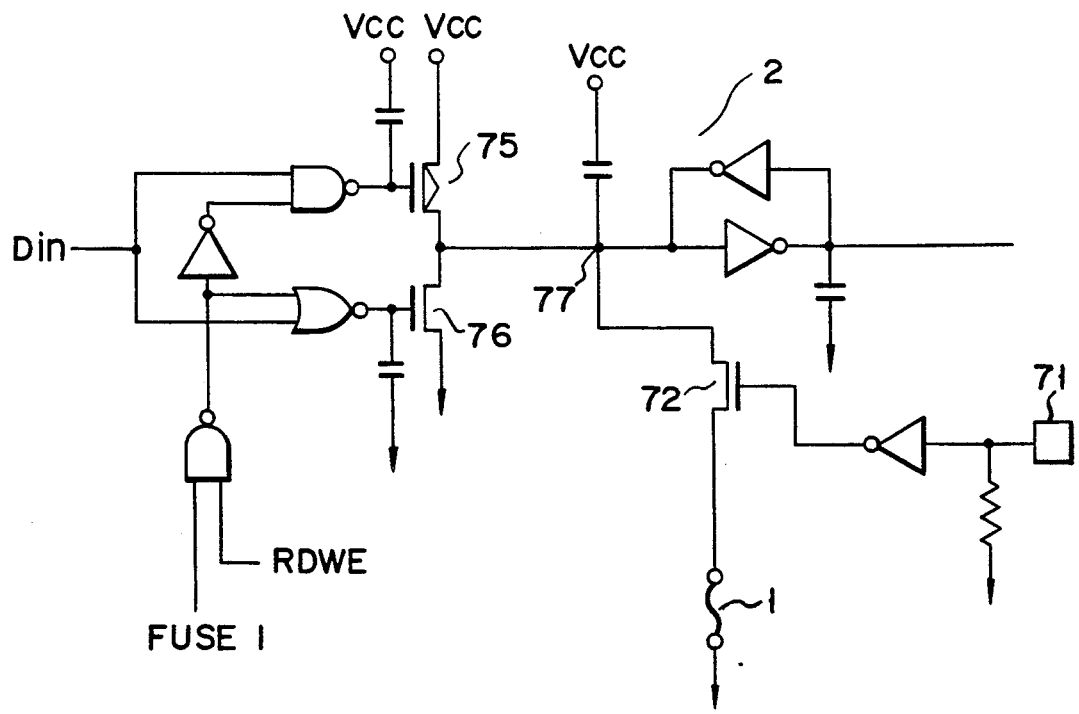
F I G. 6

ADDRESS DETECTOR OF A REDUNDANCY MEMORY CELL

BACKGROUND OF THE INVENTION

1. Field of the Invention

The present invention relates to a semiconductor memory device having redundancy memory cells and, particularly, to an address detector of a redundancy memory cell.

2. Description of the Related Art

In a semiconductor memory device having redundancy memory cells, when a defective memory cell is detected, the defective memory cell is replaced with a redundancy memory cell. The technique of redundancy thus improves the yield of such semiconductor devices.

Replacement of a defective memory cell with a redundancy cell is normally performed using a cell array column unit or a cell array row unit. Accordingly, the semiconductor memory device is provided with a plurality of redundancy columns or rows. Specifically, when an address corresponding to the column or to the row including a defective cell is input to the semiconductor memory device, selection of the column or the row including the defective cell is prohibited, and a redundancy column or row to replace respective column or row having the defective cell must instead be selected. In order to accomplish this, the redundancy circuit must have a means to store address information, or a programming element, to replace a defective memory cell with a redundancy cell.

Commonly, the programming element is a fuse which is fused, or melted, by laser. However, with the prior art techniques, it was impossible for an address detector of redundancy cells to access a redundancy cell before a defective memory cell was detected, the address was determined, and the appropriate fuse was fused.

In the case where a polysilicon fuse is used as a programming element, the fuse may be blown electrically. This raises difficult design concerns because a large current must then be supplied to the IC circuit to blow the fuse.

In some non-volatile semiconductor memory devices, an EPROM cell may be used as a programming element instead of a fuse. In this case, however, data stored in a defective address memory element is erased by radiation of ultraviolet rays. Therefore, the EPROM cell must be structured so as not to be irradiated by unwanted ultraviolet rays. In order to accomplish this, the area occupied by the memory cell must be increased, however, an increase in area is unfavorable to the design of an IC circuit.

In the prior art wafer probe test, only when a defective memory cell was found, was the defective cell subject to a substitution process, so that the probe test could not be performed on the redundancy cell when all of the memory cells were in normal operating condition. Thereby, as the integration density of semiconductor memory devices increases, the prior art probe test used in the manufacture of these devices becomes increasingly unsatisfactory because it is complicated, time-consuming and costly.

Japanese patent application No. 61-136838 addresses the above problem by providing that during a test mode a redundancy cell is selected and normal cell is non-selected. In this case, however, reading and writing to the redundancy cell can be performed only during the test mode. Also, only a specific address can be used to select the redundancy cell. Moreover, the address of the address detector in the test mode differs from that of the address detector that is eventually used.

SUMMARY OF THE INVENTION

An object of the present invention is to provide an address detector of a redundancy memory cell, for use with a memory cell, which can test the redundancy cell regardless of whether or not the memory cell is defective.

It is another object of the present invention to provide an address detector of a redundancy memory cell, for use with a memory cell, which can test the redundancy cell without replacing the memory cell with the redundancy cell.

It is another object of the present invention to provide an address detector of a redundancy memory cell, for use with a memory cell, which can test the redundancy cell without programming an associated programming element. Thus, in the case where the memory element is a fuse, the present invention tests the redundancy cell without blowing or fusing the fuse.

According to the present invention, the address detector of the redundancy memory cell includes a redundancy cell for replacing a defective cell, a programming element for storing address data for replacing a normal memory cell with a redundancy cell, a latch for latching the state of the memory element, and a data setting element for setting the state of the latch without programming the programming element. Using the present invention, a wafer probe test can be performed under the same conditions as the normal operating mode of the semiconductor memory device—that is, the address detector can simulate the conditions under which the programming element, which may be a fuse, has or has not been fused.

According to the present invention, the latch can be set by the data setting element only during a test mode. After the test is finished, the data setting element is reset, thereby the state of latch can be returned to the non-test mode state. As mentioned above, the wafer probe test of the memory device can be easily carried out without affecting the programming element, which may be a fuse.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram illustrating one embodiment of the present invention;

FIG. 2 is a circuit diagram showing a high potential detector for use with the present invention;

FIGS. 4, 5, 6 and 7 are circuit diagrams showing further embodiments of the present invention.

DETAILED DESCRIPTION OF THE PREFERRED EMBODIMENTS

Figure 3:
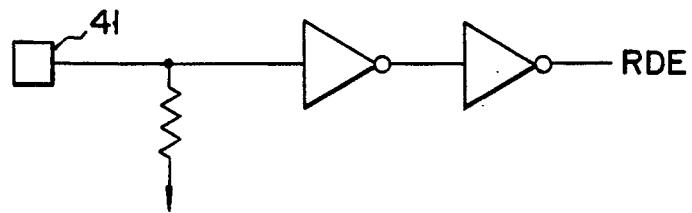
FIG. 3 is a circuit diagram showing a test pad input for use with the present invention.

FIG. 1 is a block diagram of a redundancy circuit illustrating one embodiment of the present invention. In FIG. 1, reference numeral 1 denotes a programming element for storing address data to replace a defective memory cell with a redundancy cell. As shown in FIG. 1, programming element may be a fuse. Reference numeral 5 is a data setting element, also for storing address data to replace the defective memory cell with a redundancy cell. As shown in FIG. 1, data setting element 5 may be an N-channel FAMOS, which is an EPROM cell transistor. Reference numeral 2 is a latch for latching the state of the programming element or the state of the data setting element. Reference numeral 3 refers to a writing control circuit for selectively writing an address to data setting element 5 in accordance with the address of a defective cell. Reference numeral 6 is a writing control transistor. Reference numeral 4 is a voltage changing circuit for 5V/12V.

A1 to An are address input signals of a memory and WE denotes a write enable signal. These signals are respectively used to supply writing timings. Writing to FAMOS transistor 5 is performed by applying a high voltage between its drain and gate. When FAMOS transistor 5 is to be written to, both WE and RDE are made active, and transistor 6 is turned on by designating the address of the defective cell to be replaced with the redundancy cell. Voltage changing circuit for 5V/12V operates to apply a high voltage (12V) between the drain and the gate of FAMOS transistor 5, and writing to FAMOS transistor 5 is performed. Thereby, the output of the redundancy circuit will be substantially the same as it would be if fuse 1 were fused, where, for example, the semiconductor memory device is provided with redundancy rows, the address data for a defective row for the redundancy cell replacing that defective row is thereby stored in the memory.

Figure 7:
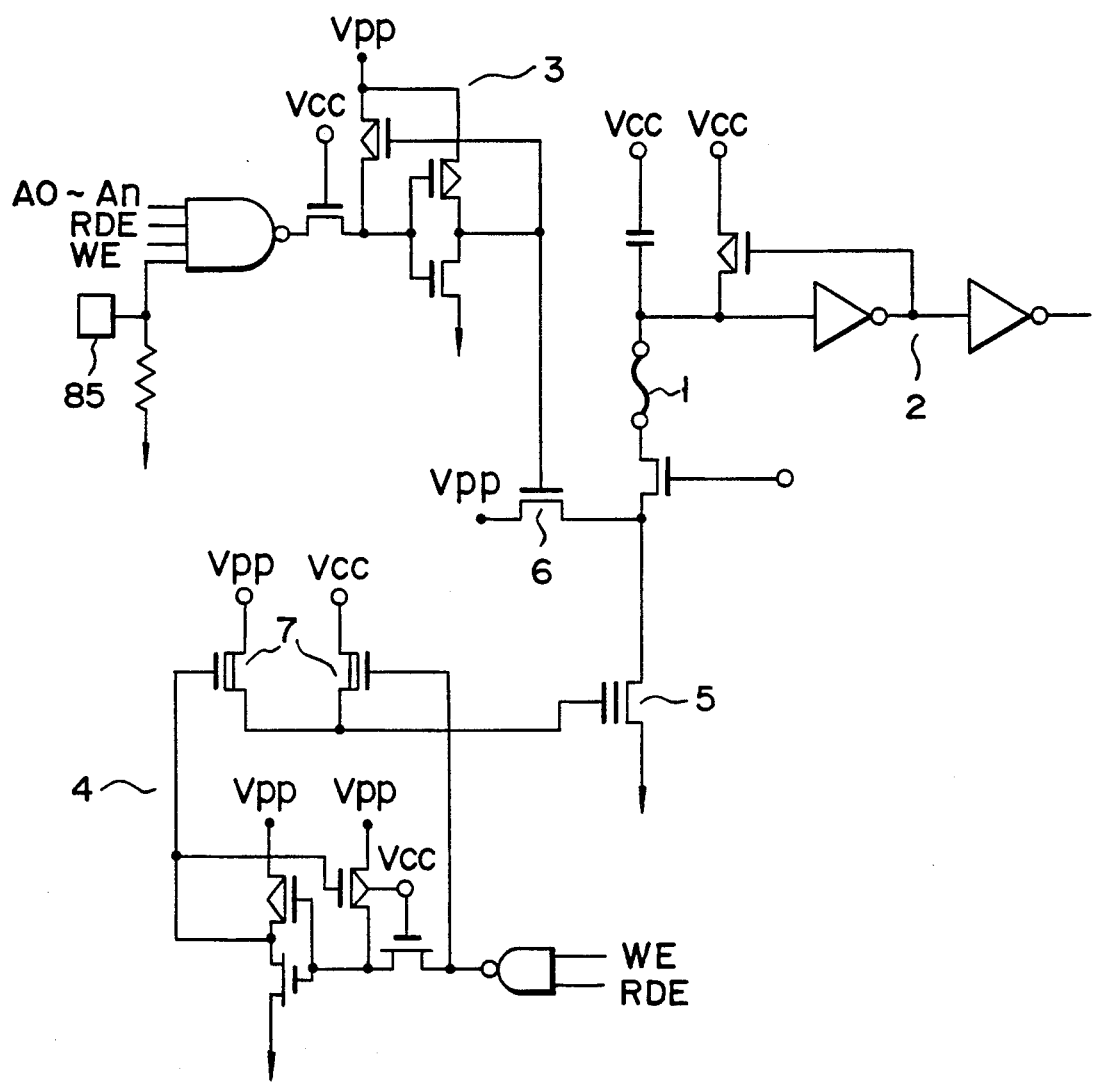

FIG. 7 shows one embodiment of the present invention, which corresponds to the above-mentioned block circuit. In the wafer probe test, if a defective cell is detected, FAMOS transistor 5 is selectively written to. If writing to the cell of FAMOS transistor 5 is completed, transistor 5 is not turned on, even if power source potential of 5V is applied to the gate of the FAMOS transistor 5, since threshold voltage is increased. Moreover, if erasing of the cell of FAMOS transistor 5 is completed, transistor 5 is turned on. This corresponds to the state fuse 1 is fused or non-fused.

Thereby, the circuit is in the same state as the state that it would be if fuse I was fused by laser, and the test can be performed with the circuit in the same state that it would be if the defective cell were replaced with the redundancy cell. After all wafer probe tests are finished, polysilicon fuse 1 can be fused by laser.

In FIG. 7, reference numeral 7 is a circuit which changes the voltage that is applied to the gate of FAMOS transistor 5, to be high (12V) when the writing to FAMOS transistor 5 is performed and to be low (5V) when the writing and reading to the memory cell are performed. Signal WE enables writing to the memory cell to be performed and signal RDE enables writing to FAMOS transistor 5 to be performed. Signal RDE can be generated as shown in FIGS. 2 and 3. FIG. 2 shows a circuit in which the output is set to a high level when a potential that is higher than power source potential Vcc is applied to an input pin 31; and the output is set to a low level when a potential that is lower than power source potential Vcc is applied to input pin 31. As shown in FIG. 3, a pad 41 may be specially provided outside the semiconductor memory device in order to provide signal RDE.

Transistor 6 of FIG. 7 selects one of a plurality of FAMOS transistors 5, whose total number is the same as the number of fuses 1. The input to the gate is address data. For example, in a system in which a defective row is replaced with a redundancy memory group by a unit of row address, the input to the gate would be redundancy row data. In this case, similar to the input to transistor 7, signals WE and RDE select one of the plurality of the redundancy memory cells. These signals may be input by a pad 85 provided outside. Also, in a case where a memory having multi-bit structure is used, data input may be decoded and selected.

Moreover, as a modification to the present invention, the input potential to the gate of FAMOS transistor 5 can be provided directly form an external pad. When writing to FAMOS transistor 5 is performed, the potential to be applied to the pad is a writing potential. When the memory test is performed, the potential is 5V. Also, if the pad is opened, the gate of FAMOS transistor 5 is set to be a power source potential. Thereby, FAMOS transistor 5 can stably operate even if the power source potential is changed in the memory test.

Figure 4:
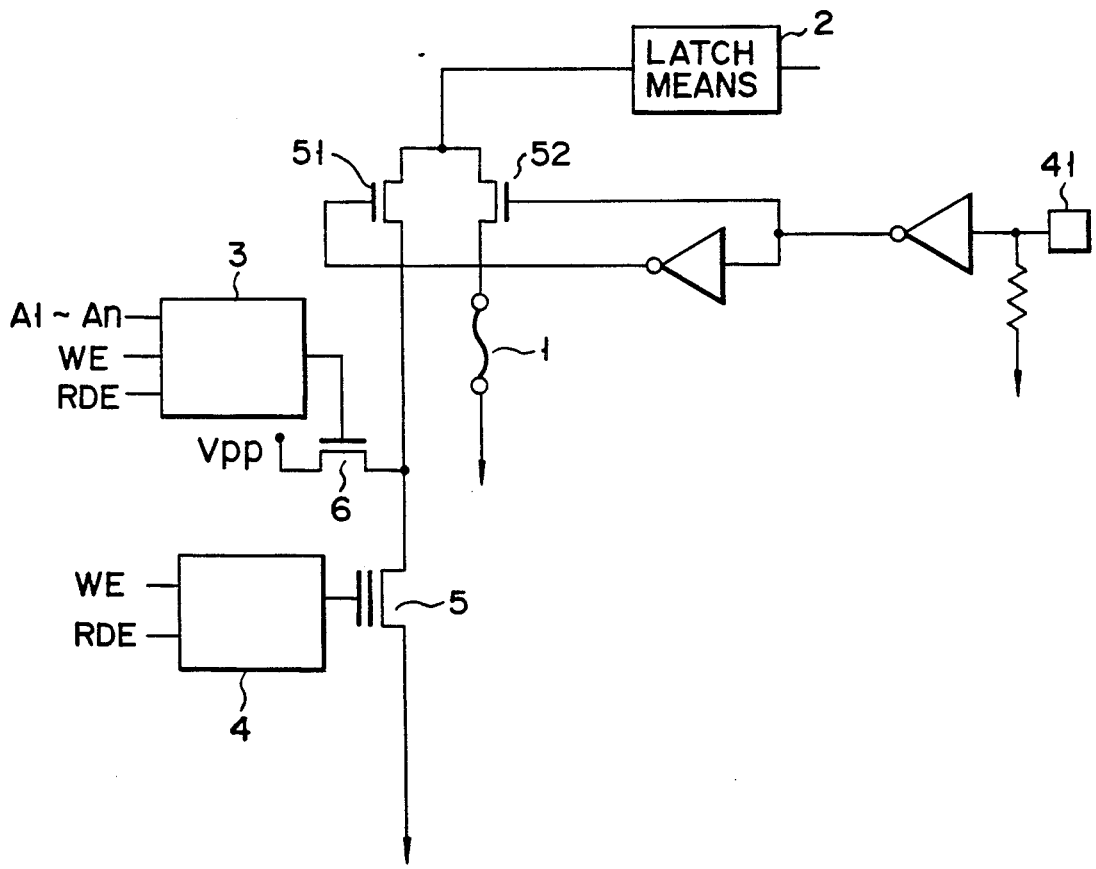

FIG. 4 shows a circuit diagram of another embodiment of the present invention. In FIG. 7, FAMOS transistor 5 and polysilicon fuse 1 are connected in series. FIG. 4 shows the example in which they are cascade-connected. In this case, transistors 51 and 52 can be changed, depending on whether selection data of redundancy cell is stored in FAMOS transistor 5 or in polysilicon fuse 1. In this case, the input of the signal for the change of the transistors 51 and 52 may performed through an external pad 41, such as shown in FIG. 3, or the input pin 31, such as shown in FIG. 2.

FIG. 5 shows yet another embodiment of the present invention. In this embodiment, a pad 65 for power source is provided for the selection of FAMOS transistor when the writing or the memory test is performed. If the pad 65 is set to be high potential (12.5V), writing to FAMOS transistor 5 is performed. If the potential is set to be low potential (5V), FAMOS transistor 5 is selected in place of fuse 1 when the memory test is performed. Reference numeral 63 is a transistor selecting FAMOS transistor 5 and fuse 1. Reference numeral 65 is a pad for a power source, and reference numeral 64 is a pad for selecting group of redundancy cells.

Since it is not necessary to take care of the consumed power if there is provided a power supply to be used only when the test is performed, a CMOS circuit can be an E/D circuit, so that the circuit and the pattern can be simplified. Moreover, since the voltage can be reliably supplied to the gate of the FAMOS transistor during the memory test, the group of the redundancy cells can be reliably selected even when, as during the test, the power of the memory is largely increased.

FIG. 6 shows yet another embodiment of the present invention. Reference numeral 71 is a pad for testing. Only when the level of pad 71 is set to high, is transistor 72 turned off. In this state, the potential of node 77 can be set by the transistors 75 and 76. Thus, if both transistors 75 and 76 are turned off, the state of the node 77 is maintained. Thereby, the same state as the case in which fuse 1 is fused be obtained.

Additionally, the transistors 75 and 76 operate by a Din signal, a fuse i signal, and a RDWE signal. The fuse i signal determines which fuse circuit is selected, and the RDWE signal sets the state of the node 77. When AND of fuse i and RDWE is "1", node 77 is set to be high level if the Din signal is "1", the node 77 is set to be high level if the Din signal is "1" and the node 77 is set to be low level if the Din signal is "0".

Figure 8:
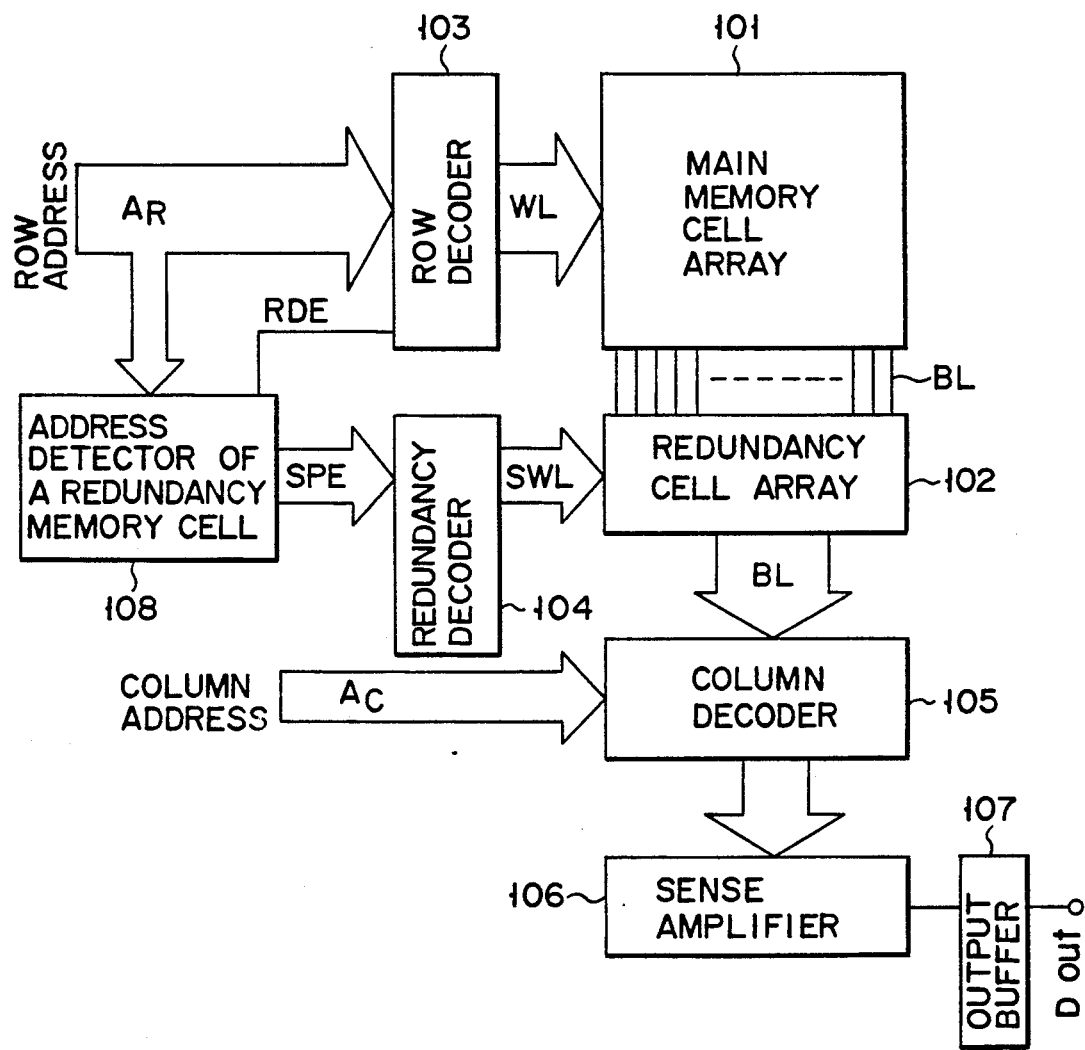
FIG. 8 is a block diagram illustrating one example of a semiconductor memory device.

FIG. 8 shows a part of circuit block of an EPROM integrated circuit as an example of a semiconductor memory device having the redundancy cells of the present invention. The memory device has a memory body including main memory cell array 101; redundancy cell array 102 sharing bit lines BL of main memory cell array 101, and having redundancy cells for replacing defective main memory cells; row decoder 103 for decoding a row address signal $A_R$, and for selecting a word line WL of the memory; sense amplifier 106 detecting a signal read from the memory cell to the bit line BL selected by column decoder 105, and for amplifying the signal; output buffer 107 for outputting output data of sense amplifier 106 and an address detector of a redundancy memory cell 108 for detecting when a defective row word line connected to the defective memory cell in the main memory cell array 101 is selected by row address signal $A_R$ (in other words, when the defective address is designated), and for selecting the redundancy decoder 104 to select the word line SWL of the redundancy cell array 102 in place of the main memory cell array 101. The structure of the decoder of the present invention shown in FIG. corresponds to the address detector 108. FIG. 8 shows the case in which the redundancy memory cell was provided only in the row direction, to simplify the explanation. However, alternatively, redundancy memory cell may be provided in the column direction.

In the above memory, when a main memory cell array 101 is selected, an address detector of a redundancy memory cell 108 sets a preliminary row enable signal SPE output, which is used for controlling the select/non-select of redundancy decoder 104, to be in a non-select state; and sets a row decoder enable signal RDE, which is used for controlling the select/non-select of the row decoder 103, to be in a select state. Thus, redundancy decoder 104 and redundancy cell array 102 are not selected and a predetermined word line WL of main memory cell array 101 is selected by row decoder 103. Data of main memory cell array connected to the selected word line is output to the bit line BL, and the signal of only the predetermined bit line, which is selected by the column decoder 105, is input to sense amplifier 106 and converted into a binary date of "1" or "0". Thereafter, the converted data is output via output buffer 107 as an output data Dout.

According to the present invention, the state of the address detector for the redundancy memory cell can be set without using fusing a polysilicon fuse, the address detector for the redundancy cell array can be operated by data of the defective cell detected by the tester during the wafer probe test similar to the time when the address detector is normally used. Thereby, since the test of the redundancy cell can be performed without fusing the fuse by laser, the steps of the test of the semiconductor memory can be simplified. Moreover, since the polyfuse is eventually fused by laser, it is unnecessary to provide reliability to FAMOS of FIG. 1, and the design can be further simplified.

According to the embodiments of FIGS. 4 and 6, since the address detector for the redundancy cell array can be changed to another state after fusing the polisilicon fuse, the defects relating to the address detector for the redundancy cell array can be analyzed.

In the embodiment according to FIG. 6, it is unnecessary to use the FAMOS transistor 5 as a temporary memory element. Moreover, since there is no writing circuit, the design can considerably be simplified.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An addressing circuit for use with a memory cell of a semiconductor memory device, comprising:
   a redundancy memory cell;
   a fuse for replacing the memory cell with said redundancy cell, said fuse having at least two possible states;
   a latch means for latching the state of said fuse; and
   a data setting means for setting said latch means regardless of the state of said fuse.

2. An addressing circuit for use with a semiconductor memory device having a memory cell and a redundancy said memory cell in the event that it is defective, said circuit comprising:
   a programming element having at least two possible states for respectively enabling and disabling the addressing of said redundancy cell;
   a latch means for latching the state of said programming element; and
   a data setting means for, in a test mode, setting said latch means to either of said two states.

3. The addressing circuit according to claim 2, wherein said programming element comprises a fuse.

4. The addressing circuit according to claim 2, wherein said data setting means comprises a FAMOS transistor.

5. The addressing circuit according to claim 4, further comprising:
   a write control circuit for supplying a write signal to said data setting means; and
   a transistor having its drain coupled to a drain of said FAMOS transistor, its source coupled to a power supply, and its gate coupled to said write control circuit.

6. The addressing circuit according to claim 2, further comprising:
   a bonding pad coupled to said data setting means for supplying a write signal to said data setting means.

7. The addressing according to claim 2, further comprising a switch means for selectively coupling said latch means to said programming element and said latch means to said data setting means.

8. The addressing circuit according to claim 7, further comprising a bonding pad for receiving a control signal for controlling said switch means.

9. A semiconductor memory device comprising:
   a memory cell array having a plurality of word lines and bit lines;

a redundancy cell array coupled to said bit lines of said memory cell array and for respectively replacing memory cells of said memory cell array in the event they are defective;

a programming element having two states for respectively enabling and disabling the addressing of one of said redundancy cells;

a latch means for latching the state of said programming element; and a data setting means for, in a test mode, setting said latch means to enable or disable the addressing of said redundancy cell.

10. The semiconductor memory device according to claim 9, further comprising:

a memory cell address decoder for decoding an address signal of said memory cell array;

a redundancy cell address decoder for detecting when a defective address of said memory cell array has been selected by said address signal; and a redundancy decoder for selecting an address of said redundancy cell array to replace said defective address of said memory cell array.

11. The semiconductor memory device according to claim 9, wherein said programming element comprises a fuse.

12. The semiconductor memory device according to claim 9, wherein said data setting means comprises a FAMOS transistor.

13. The semiconductor memory device according to claim 12, further comprising:

a write control circuit for supplying a write signal to said data setting means; and a transistor having its drain coupled to a drain of said FAMOS transistor, its source coupled to a power supply, and its gate coupled to said write control circuit.

14. The semiconductor memory device according to claim 9, further comprising:

a bonding pad coupled to said data setting means for supplying a wrtie signal to said data setting means.

15. The semiconductor memory device according to claim 9, further comprising a switch means for selectively coupling said latch means to said programming element and said latch means to said data setting means.

16. The semiconductor memory device according to claim 15, further comprising a bonding pad for receiving a control signal for controlling said switch means.

17. A semiconductor memory device comprising:

a memory cell array having a plurality of word lines and bit lines;

a redundancy cell array, coupled to said bit lines of said memory cell array, for respectively replacing memory cells of said memory cell array in the event that they are defective;

a first means for specifying address information representing which cell of the memory cell array is to be replaced by a cell of the redundancy cell array; and a second means for specifying, for a predetermined period of time, address information representing which cell of the memory cell array is to be replaced by a cell of the redundancy cell array.

18. The semiconductor memory device according to claim 17, wherein said first means comprises a fuse.

19. The semiconductor memory device according to claim 17, wherein said second means comprises a FAMOS transistor.

20. The semiconductor memory device according to claim 19, further comprising:

a write control circuit for supplying a write signal to said FAMOS transistors; and a transistor having its drain coupled to a drain of said FAMOS transistor, its source coupled to a power supply, and its gate coupled to said write control circuit.

21. The semiconductor memory device according to claim 17, further comprising:

a bonding pad coupled to said second means for supplying a write signal to said second means.

22. The semiconductor memory device according to claim 17, further comprising a latch means for latching the state of said first means.

23. The semiconductor memory device according to claim 22, further comprising a switch means for selectively coupling said latch means to said first means and said latch means to said second means.

24. The semiconductor memory device according to claim 23, further comprising a bonding pad for receiving a control signal for controlling said switch means.

* * * * *